US 12,230,730 B2

(12) United States Patent
Lee et al.

(10) Patent No.: US 12,230,730 B2
(45) Date of Patent: Feb. 18, 2025

(54) SOLAR PANEL CUTTING UNIT

(71) Applicant: WON KWANG S&T CO., LTD., Incheon (KR)

(72) Inventors: Sang Hun Lee, Incheon (KR); Jun Kee Kim, Seoul (KR); Tae Eun Lee, Incheon (KR); Cheong Min Noh, Incheon (KR)

(73) Assignee: WON KWANG S&T CO., LTD., Incheon (KR)

( * ) Notice: Subject to any disclaimer, the term of this patent is extended or adjusted under 35 U.S.C. 154(b) by 351 days.

(21) Appl. No.: 17/783,604

(22) PCT Filed: Sep. 16, 2021

(86) PCT No.: PCT/KR2021/012665
§ 371 (c)(1),
(2) Date: Jun. 8, 2022

(87) PCT Pub. No.: WO2022/085956
PCT Pub. Date: Apr. 28, 2022

(65) Prior Publication Data
US 2023/0006090 A1    Jan. 5, 2023

(30) Foreign Application Priority Data

Oct. 22, 2020 (KR) .................... 10-2020-0137572

(51) Int. Cl.
*H01L 31/18* (2006.01)
*B26D 1/00* (2006.01)
*B26D 1/547* (2006.01)

(52) U.S. Cl.
CPC ............ *H01L 31/1876* (2013.01); *B26D 1/00* (2013.01); *B26D 1/547* (2013.01)

(58) Field of Classification Search
CPC .......... B32B 43/003; B09B 5/00; B09B 3/35; B09B 3/00; B09B 2101/15; B09B 3/40;
(Continued)

(56) References Cited

U.S. PATENT DOCUMENTS 547,433 A * 10/1895 Hazewinkel ........... B26D 7/018
83/810
4,363,251 A * 12/1982 Carlson ................ B26D 7/0625
83/425.2
(Continued)

FOREIGN PATENT DOCUMENTS

JP    2012-023097 A    2/2012
JP    2013003299 A *  1/2013  ............... B26D 3/28
(Continued)

OTHER PUBLICATIONS

International Search Report for PCT/KR2021/012665 mailed on Dec. 30, 2021.

*Primary Examiner* — Ghassem Alie
(74) *Attorney, Agent, or Firm* — The PL Law Group, PLLC

(57) ABSTRACT

A solar panel cutting unit according to an embodiment can separate layers of a solar panel from each other at once. The solar panel cutting unit separates thin layers of a solar panel from each other and includes a frame, a panel transporting mechanism that is provided at the frame and lowers the solar panel in a vertical direction such that adhesion lines of the thin layers are arranged downward, a pair of guide roller units that is positioned below the panel transporting mechanism and guides and lowers the solar panel, and a wire cutting mechanism that includes a pair of support rollers and cutting wires which connect the support rollers to each other and extend in the same direction as the adhesion lines such
(Continued)

that the wire cutting mechanism separates the thin layers of the solar panel from each other.

9 Claims, 8 Drawing Sheets

(58) Field of Classification Search
CPC . B26D 1/547; B26D 1/50; B26D 3/28; B26D 1/0006; B26D 2001/008; B26F 3/002; Y02W 30/20; Y02W 30/51; H01L 31/048; H01L 31/1876; H04N 7/18; Y20W 30/82
USPC ............... 83/307.1, 803; 156/252, 304, 582; 29/426.4, 402.03, 762; 445/2
See application file for complete search history.

(56) References Cited

U.S. PATENT DOCUMENTS

| | | | | |
|---|---|---|---|---|
| 4,408,510 | A * | 10/1983 | Reuter | B23Q 7/007 83/869 |
| 4,589,320 | A * | 5/1986 | Kaster | B23D 55/04 83/730 |
| 6,179,909 | B1 * | 1/2001 | Banzawa | B28D 5/0088 125/16.02 |
| 6,470,780 | B1 * | 10/2002 | Benuzzi | B27B 31/04 83/581 |
| 7,150,804 | B2 * | 12/2006 | Tajima | G09F 7/18 156/707 |
| 8,065,995 | B2 * | 11/2011 | Bakshi | B28D 5/0076 125/16.02 |
| 8,205,534 | B2 * | 6/2012 | Yazawa | B23D 57/0007 83/789 |
| 11,267,158 | B1 * | 3/2022 | Kilgore | B27C 7/00 |
| 2010/0064871 | A1 * | 3/2010 | Koch | B28B 11/16 83/692 |
| 2010/0199818 | A1 * | 8/2010 | Lee | B26D 1/547 83/16 |
| 2013/0042736 | A1 * | 2/2013 | Deng | B26D 7/01 414/800 |
| 2016/0118286 | A1 | 4/2016 | Mao | |
| 2016/0151844 | A1 * | 6/2016 | Go | B23D 51/16 83/785 |
| 2018/0186026 | A1 * | 7/2018 | Annequin | B26F 3/12 |

FOREIGN PATENT DOCUMENTS

| | | |
|---|---|---|
| JP | 2016-203061 A | 12/2016 |
| KR | 10-0783028 B1 | 12/2007 |
| KR | 10-2009-0081360 A | 7/2009 |
| KR | 10-2013-0015546 A | 2/2013 |
| KR | 10-2101583 B1 | 5/2020 |
| KR | 10-2020-0070911 A | 6/2020 |
| KR | 10-2154030 B1 | 9/2020 |
| KR | 10-2021-0015287 A | 2/2021 |
| WO | WO-0005021 A1 * | 2/2000 ......... B23D 57/0069 |

* cited by examiner (a)

(b)

(a)

(b)

SOLAR PANEL CUTTING UNIT

CROSS REFERENCE TO RELATED APPLICATIONS AND CLAIM OF PRIORITY

This application claims benefit under 35 U.S.C. 119, 120, 121, or 365(c), and is a National Stage entry from International Application No. PCT/KR2021/012665, filed Sep. 16, 2021, which claims priority to the benefit of Korean Patent Application No. 10-2020-0137572 filed in the Korean Intellectual Property Office on Oct. 22, 2020, the entire contents of which are incorporated herein by reference.

BACKGROUND

1. Technical Field

The present invention relates to a solar panel cutting unit, and more specifically to a solar panel cutting unit that can separate layers of a solar panel from each other at once.

2. Background Art

This invention was made with government support under the national R&D program of South Korea (Project Identification Number: 1485017207; Project Number: 2020003100003; Ministry Name: Ministry of Environment; Project Management (Specialized) Institute Name: Korea Environmental Industry & Technology Institute; Research Program Title: Technology Development Program for Improvement in Cyclical Availability of Recycling Inhibitory Product; Research Project Title: Technology Development of Collecting Discarded Solar Panel and Collecting Crush-Based Valuable Material; Contribution Ratio: 1/1; Project Performing Agency Name: WonKwang S&T Co., Ltd.; Research Period: May 21, 2020 to Dec. 31, 2022) awarded by Korea Ministry of Environment (MOE).

The solar power generation industry is an eco-friendly power generation industry in which a fossil fuel is not used and has been steadily growing since early 2000. The growth of the solar power generation industry results in a steady increase in the number of solar panels which are installed throughout South Korea, and thus a problem of disposing of old solar panels arises. A service life of a solar panel is about 15 to 25 years, although it may be different for each product. Recently, as performance of the solar panel is improved, a solar panel having low power generation efficiency is culled early, and thus the number of discarded solar panels is rapidly increased.

The number of discarded solar panels is expected to gradually increase in the future, and thus various technologies for disposing discarded solar panels are currently proposed. One of the common methods for disposing solar panels is a method to first physically separate an aluminum frame from the solar panel and then crush and bury a panel substrate or to recycle extractable metal or the like such as copper or silver through a chemical treatment. However, a chemical treatment method is limitedly used because of a possibility of causing another problem of environmental pollution. In addition, there is no easy method for separating a glass plate and a backsheet layer from the solar panel, and thus a separation process or apparatus needs to be improved.

In particular, since an adhesive layer provided between layers of a solar panel to connect the layers has a thin thickness, it is difficult to separate the layers from each other with accuracy, and it is also difficult to separate a plurality of layers simultaneously. Hence, a problem arises in that layers of the solar panel are not easy to separate from each other by an existing process or apparatus.

SUMMARY

A technical object to be achieved by the present invention is to provide a solar panel cutting unit that can separate layers of a solar panel from each other at once.

Technical objects of the present invention are not limited to the technical object mentioned above, and the following description enables those skilled in the art to clearly understand other unmentioned technical objects.

According to the present invention, there is provided a solar panel cutting unit that separates a plurality of thin layers of a solar panel from each other, the solar panel cutting unit including: a frame; a panel transporting mechanism that is provided at the frame and lowers the solar panel in a vertical direction such that adhesion lines of the thin layers are arranged downward; a pair of guide roller units that is positioned below the panel transporting mechanism and guides and lowers the solar panel; and a wire cutting mechanism that includes a pair of support rollers and cutting wires which connect the support rollers to each other and extend in the same direction as the adhesion lines such that the wire cutting mechanism separates the thin layers of the solar panel from each other.

At least one of the wire cutting mechanism and the pair of guide roller units may be moved to match locations of the adhesion lines and the cutting wires.

The solar panel cutting unit may further include an image recognition unit that is provided below the cutting wires, images the solar panel and the cutting wires, and locates of the adhesion lines and the cutting wires.

The solar panel may have a plurality of the adhesion lines formed in parallel between the plurality of thin layers. The cutting wires may be disposed at a plurality of respective locations at the same intervals as the adhesion lines.

An outer circumferential surface of each of the support rollers may have a plurality of guide grooves into which the cutting wires are inserted to be moved and which are formed at the same intervals as the plurality of adhesion lines.

The support rollers may be moved in a length direction of respective rotary shafts such that locations of the cutting wires can match locations of the adhesion lines.

The panel transporting mechanism may stand the solar panel, which is loaded in a horizontal direction with an absorption surface absorbing solar light facing upward or downward, vertically upright and lower the solar panel.

The panel transporting mechanism may have a holder which holds a leading end or a trailing end of the solar panel and a manipulation element which lifts or lowers the holder.

The solar panel cutting unit may further include a horizontal transport mechanism that moves the solar panel in the horizontal direction and delivers the solar panel to the panel transporting mechanism.

The solar panel cutting unit may further include a heater that is provided at the frame and heats the solar panel.

The solar panel cutting unit according to the present invention has advantages in that several layers stacked in a solar panel can be easily separated from each other at once, and the separated thin layers can be recycled suitably regarding materials thereof.

In particular, adhesive portions of the solar panel having very thin adhesive portions between layers can be accurately cut using wires, and thus the layers can be cleanly separated from each other. Further, the adhesive portions can be more accurately cut by imaging and adjusting locations of the adhesive portions and wires.

In addition, in a process of separating the layers of the solar panel from each other, the solar panel can be heated to melt the adhesive layer, and thus a glass layer can be easily separated with less force.

DETAILED DESCRIPTION

Advantages, features, and methods for achieving the advantages and the features are to be more clearly described with reference to embodiments which will be described below in detail together with the accompanying drawings. However, the present invention is not limited to the embodiments disclosed hereinafter but can be realized in various different embodiments; simply, the embodiments are provided to complete the disclosure of the present invention and completely inform those with ordinary skill in the art to which the present invention pertains of the scope of the present invention, and the present invention is only defined by the scope of the claims. Through the entire specification, the same reference signs represent the same configurational elements, respectively.

Hereinafter, a solar panel cutting unit according to an embodiment of the present invention will be described in detail with reference to FIGS. 1 to 9.

Figure 1:
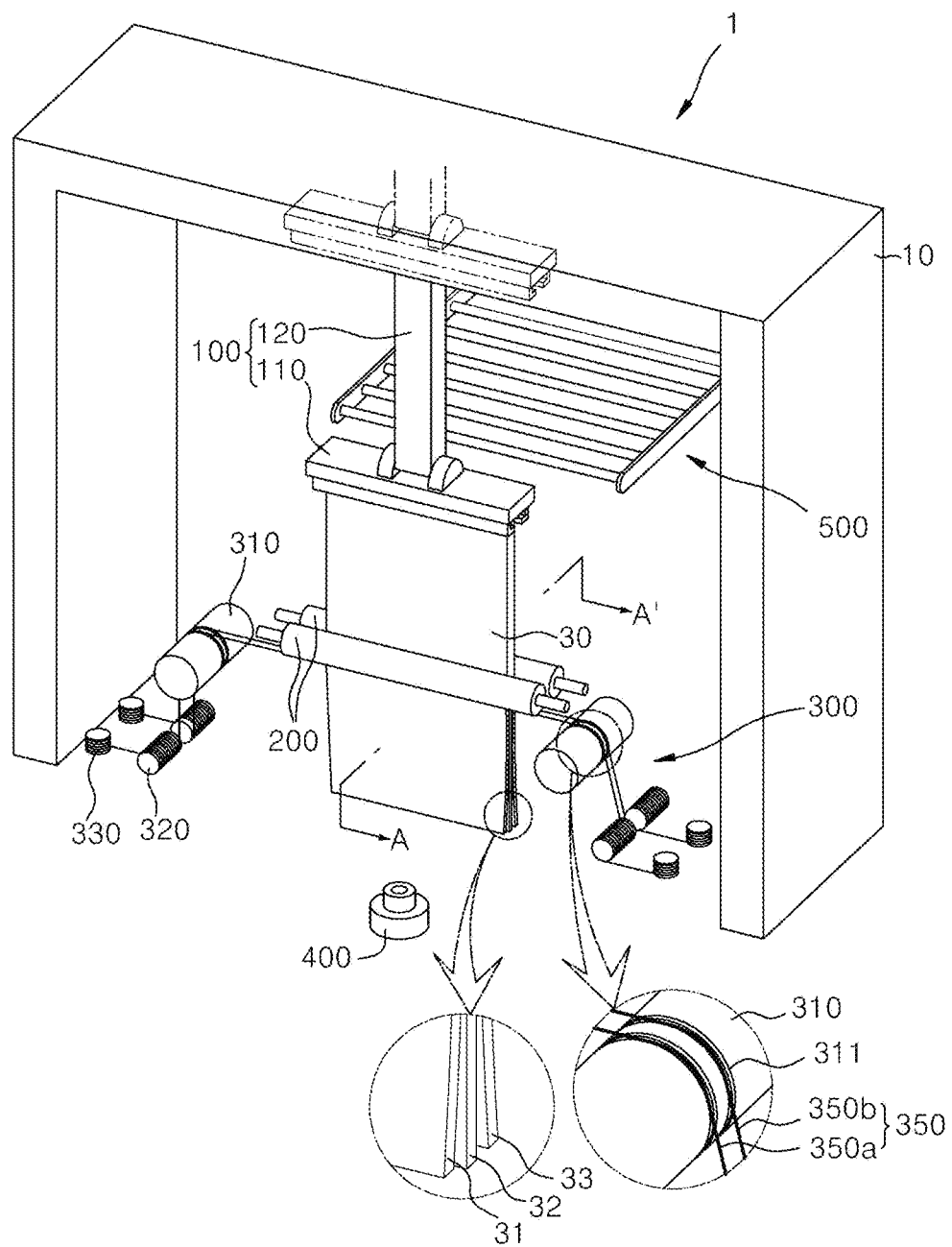
FIG. 1 is a perspective view illustrating a solar panel cutting unit according to an embodiment of the present invention.
Figure 2:
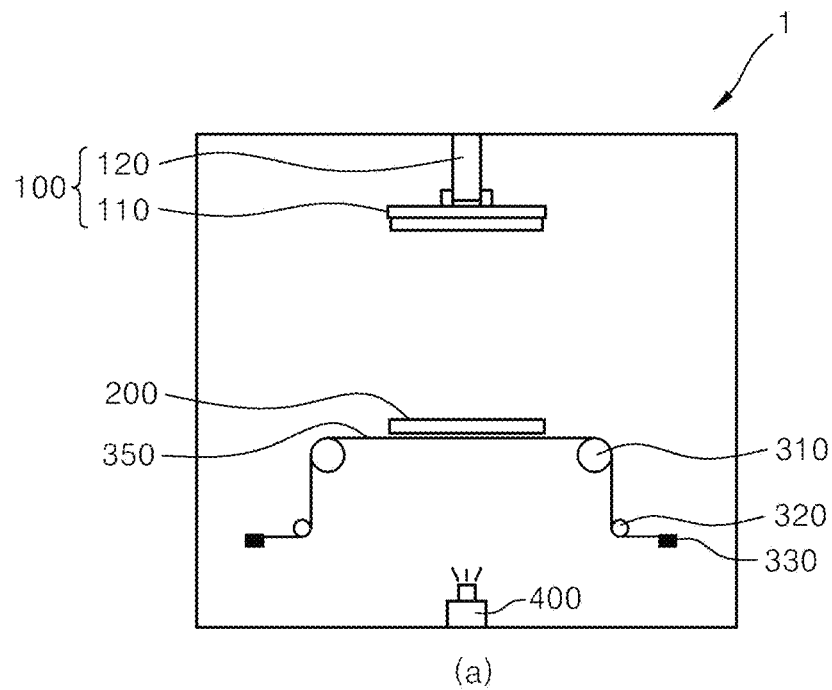
FIG. 2 is a view schematically illustrating the solar panel cutting unit illustrated in FIG. 1.
Figure 2:
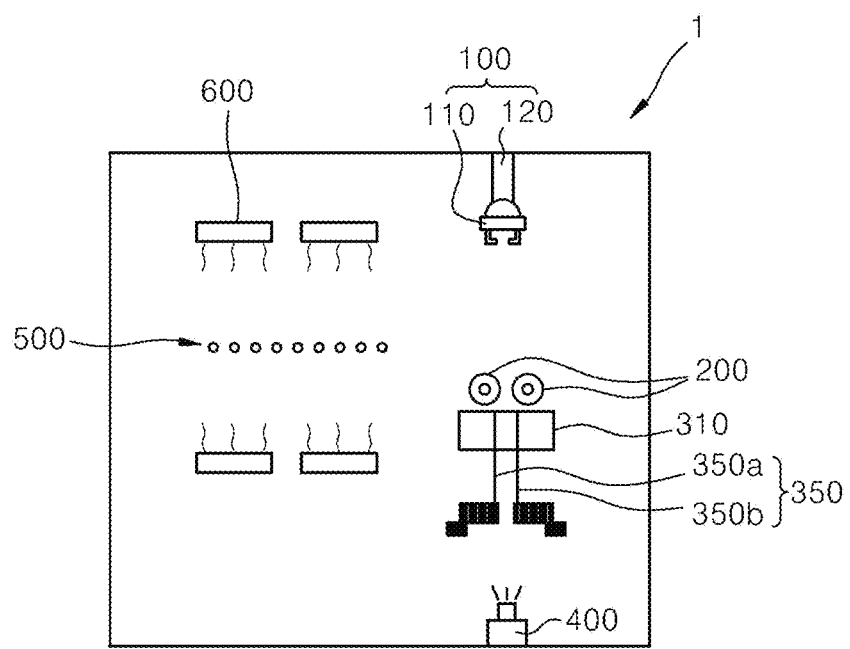
Figure 3:
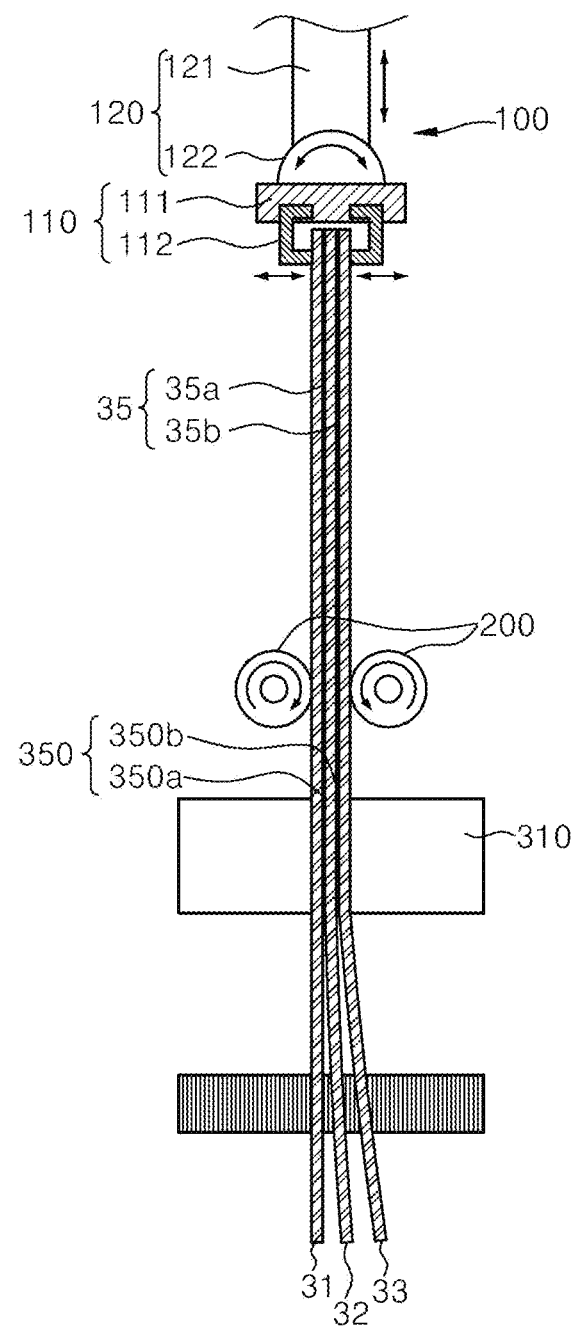
FIG. 3 is a cross-sectional view taken along line A-A' in FIG. 1.
Figure 4:
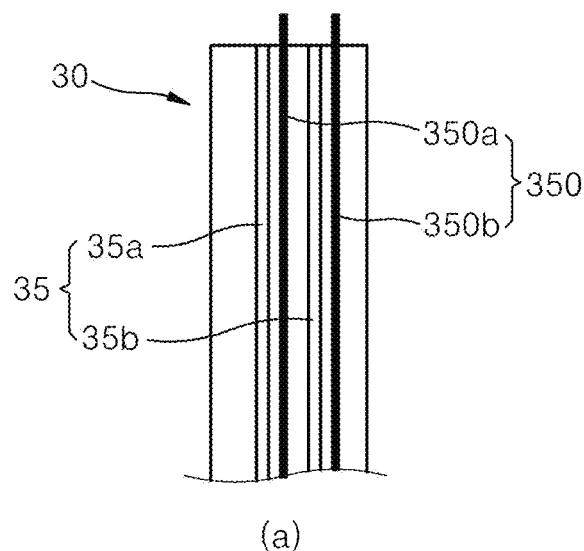
FIG. 4 is a view illustrating a usage example of an image recognition unit.
Figure 4:
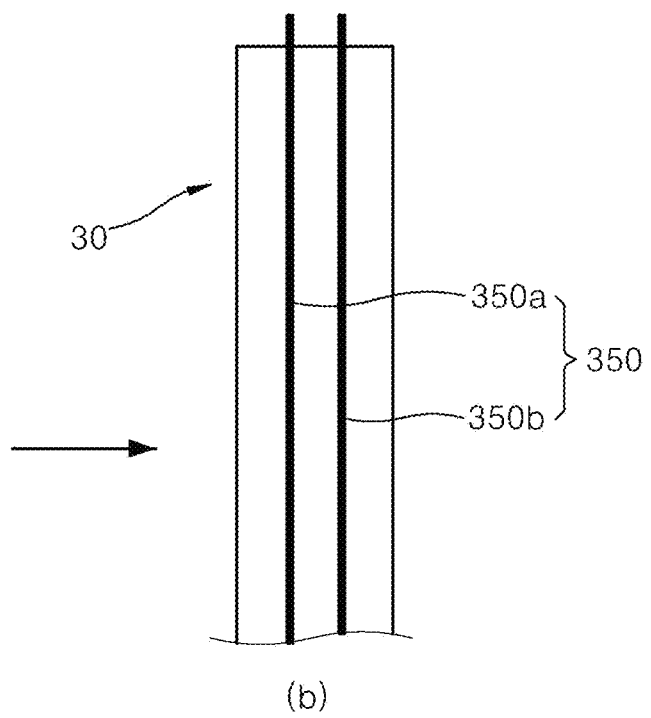

FIG. 1 is a perspective view illustrating a solar panel cutting unit according to an embodiment of the present invention. FIG. 2 is a view schematically illustrating the solar panel cutting unit illustrated in FIG. 1. FIG. 3 is a cross-sectional view taken along line A-A' in FIG. 1. FIG. 4 is a view illustrating a usage example of an image recognition unit.

With reference to FIGS. 1 to 3, a solar panel cutting unit 1 according to the present invention can separate several layers stacked in a solar panel 30 from each other at once. The solar panel 30 has a structure in which a glass plate 31, a solar cell layer 32, and a backsheet layer 33 are stacked sequentially. In other words, as illustrated in FIG. 3, the solar panel 30 has a structure in which the glass plate 31, a first adhesive layer 35a, the solar cell layer 32, a second adhesive layer 35b, and the backsheet layer 33 are stacked sequentially and adhered to each other. In this specification, a thin layer indicates each of the glass plate 31, the solar cell layer 32, and the backsheet layer 33, and an adhesion line indicates a line formed by the first adhesive layer 35a and the second adhesive layer 35b between each of the thin layers. The number of adhesion line can be increased or decreased depending on the number of thin layers.

The solar panel cutting unit 1 can stand the solar panel 30 vertically upright and can accurately cut along the thin adhesion lines. The solar panel cutting unit 1 cuts from a lower end portion toward an upper end portion of the vertically upright solar panel 30 and cut along the adhesion lines by using thin wires. When the solar panel 30 is cut in a horizontal state, a cutting force is applied in a horizontal direction and the force of gravity is applied in a vertical direction, thus the thin layers press the wires in the direction of gravity. Hence, accuracy is decreased, and the cutting force is remarkably decreased. The solar panel cutting unit 1 has an efficient structure of standing the solar panel 30 vertically upright and cutting the solar panel by inhibiting the accuracy and the cutting force from being decreased.

The solar panel cutting unit 1 separates a plurality of thin layers in a vertically upright state by causing cutting wires to pass along the adhesion lines between the thin layers. In particular, the solar panel cutting unit 1 lowers the solar panel 30 vertically and separates the thin layers from each other in a state of disposing cutting wires 350 at locations corresponding to adhesion lines of the solar panel 30. In this case, the image recognition unit 400 images the solar panel 30 and the cutting wires 350, and locations of the adhesion lines and the cutting wires 350 can be matched with accuracy.

Hereinafter, specific configurations of the solar panel cutting unit 1 will be described.

The solar panel cutting unit 1 is configured as follows. The solar panel cutting unit 1 separates the plurality of thin layers of the solar panel 30 from each other, and the solar panel cutting unit 1 includes a frame 10, a panel transporting mechanism 100 that is provided at the frame 10 and lowers the solar panel 30 in a vertical direction such that the adhesion lines of the thin layers are arranged downward, a pair of guide roller units 200 that is positioned below the panel transporting mechanism 100 and guides and lowers the solar panel 30, and a wire cutting mechanism 300 that includes a pair of support rollers 310 and the cutting wires 350 which connect the support rollers 310 to each other and extend in the same direction as the adhesion lines such that the wire cutting mechanism separates the thin layers of the solar panel 30 from each other.

First, the panel transporting mechanism 100 is provided at an upper part of the frame 10, holds an end portion of the solar panel 30, and lowers the solar panel in the vertical direction. In addition, the panel transporting mechanism 100 has functions of standing the horizontally supplied solar panel 30 vertically upright and lowering the solar panel in the vertical direction. The panel transporting mechanism 100 is provided to be movable along the frame 10, and a height and an angle of the panel transporting mechanism can be adjusted. That is, the panel transporting mechanism 100 can be a device such as an industrial robot that can freely move. The panel transporting mechanism 100 can vertically lift the solar panel 30 which is transported along a horizontal moving mechanism 500 located at one side. The horizontal moving mechanism 500 can be configured of a plurality of transport rollers and can transport the solar panel 30 in a state where a reflective surface of the solar panel 30 is parallel to the ground.

The panel transporting mechanism 100 includes a holder 110 which holds the solar panel 30 and a manipulation element 120 which enables the holder 110 to move and rotate.

The manipulation element 120 is operated to vertically lift the horizontally supplied solar panel 30 and can adjust a location and an angle of the solar panel 30. The manipulation element 120 has a cylinder shape, in which a length of a body can be adjusted, and is provided to be movable at the upper part inside the frame 10. The manipulation element 120 includes a vertical manipulation element 121 which is movable along the frame 10 and of which a length of a body is adjustable and a rotational manipulation element 122 which is provided at an end of the vertical manipulation element 121 and rotatably connects the holder 110 and the vertical manipulation element 121 to each other. The holder 110 can be rotatably coupled to the rotational manipulation element 122 positioned at an end of the manipulation element 120 and can hold and fix the solar panel 30. Specific configurations of the manipulation element 120 and the holder 110 will be described below in detail. On the other hand, the panel transporting mechanism 100 is not limited to the embodiment of the present invention and can be variously modified. For example, the panel transporting mechanism 100 can have a roller shape to hold both surfaces of the solar panel 30, and the entire roller can be moved to rotate the solar panel 30 from the horizontal direction to the vertical direction. That is, the panel transporting mechanism 100 can be variously modified to have a structure of holding the horizontally supplied solar panel 30 and lowering the solar panel in the vertical direction.

On the other hand, the guide roller units 200 are positioned below the panel transporting mechanism 100 in a lowering direction of the solar panel 30 and fulfill a function of guiding the solar panel 30 to a lowering location. In this case, the guide roller units 200 enable the solar panel 30 to maintain a plate shape and be accurately supplied to the wire cutting mechanism 300. The pair of guide roller units 200 is positioned at front and rear sides of the solar panel 30, presses front and rear surfaces of the solar panel 30, and transports the solar panel. The pair of guide roller units 200 can transport the solar panel 30 while rotating along with movement of the solar panel 30. The wire cutting mechanism 300 is positioned below the guide roller units 200, and the wire cutting mechanism 300 separates the layers of the solar panel 30 supplied by the guide roller units 200.

The wire cutting mechanism 300 includes the support rollers 310, auxiliary rollers 320, a wire winders 330, and the cutting wires 350.

The wire cutting mechanism 300 is positioned below the guide roller units 200 and cuts the adhesive layers 35 of the solar panel 30 by using the pair of cutting wires 350. The wire cutting mechanism 300 includes the cutting wires 350 which extend to correspond locations of the respective adhesive layers 35 and provide a cutting force, the support rollers 310 which enable tension of the cutting wires to be maintained and transport the cutting wires 350, the auxiliary rollers 320, and the wire winders 330. The cutting wires 350 include a first cutting wire 350a and a second cutting wire 350b. The first cutting wire 350a cuts the first adhesive layer 35a, and the second cutting wire 350b cuts the second adhesive layer 35b.

The pair of support rollers 310 are arranged to be perpendicular to the guide roller units 200 and fulfills a function of supporting the pair of cutting wires 350 which moves in a circumferential direction of the support rollers. The support rollers 310 can move in an axial direction and can adjust locations of the cutting wires 350. In addition, each of the support rollers 310 has a pair of guide grooves 311 formed to be sunken in the circumferential direction thereof. The pair of guide grooves 311 is positioned to be separated from each other by a distance between a pair of adhesive layers 35. A set of the first cutting wire 350a and the second cutting wire 350b is inserted into the guide grooves 311. The cutting wires 350 are arranged to be parallel to the guide roller units 200 and are disposed at locations which overlap the adhesive layers 35 of the solar panel 30. That is, the first cutting wire 350a is positioned to overlap the first adhesive layer 35a, and the second cutting wire 350b is positioned to overlap the second adhesive layer 35b. Both end portions of each of the cutting wires 350 are wound around the wire winders 330, and the cutting wire can move in one direction from the wire winder 330 at one side to the wire winder 330 at the opposite side thereof or in both directions. Otherwise, the wire winders 330, around which both end portions are wound, are connected to each other, and thus the cutting wire can move only in one direction on an endless track. At least one auxiliary roller 320 is disposed between the support rollers 310 and the wire winders 330 and fulfills a function of maintaining the tension of the cutting wires 350. The number or arrangement of auxiliary rollers 320 can be variously modified.

Meanwhile, (a) of FIG. 2 is a view schematically illustrating the solar panel cutting unit illustrated in FIG. 1 when viewed from the front thereof, and (b) of FIG. 2 is a view schematically illustrating an appearance of the solar panel cutting unit illustrated in FIG. 1 when viewed from a side thereof. As illustrated in (b) of FIG. 2, heaters 600 can preheat the solar panel 30 transported along the horizontal moving mechanism 500 to decrease adhesive strength of the adhesive layers 35. The heater 600, which is similar to a heating element or the like, can release heat to increase a temperature around the solar panel 30 and can transmit radiant heat to the solar panel 30. The heater 600 can be a heating element similar to a heat transfer pipe, steam, or the like which increases a temperature in the atmosphere. The heater 600 can be positioned along an inner surface of the frame 10 and, furthermore, can be provided to be inserted into the frame 10. A location and a structure of the heater 600 are not limited, and the heater can be modified to have various structure in which heat can be transmitted to the solar panel 30. For example, the heater 600 can be provided at a side surface of the panel transporting mechanism 100 to heat the solar panel 30 lowered along the panel transporting mechanism 100 or can be inserted into shafts of the pair of guide roller units 200 to heat surfaces of the guide roller units 200 and apply conductive heat to the solar panel 30.

When the solar panel 30 having a stacked structure is vertically lowered, the cutting wires 350 penetrate the solar panel, and the glass plate 31, the solar cell layer 32, and the backsheet layer 33 are separated from each other. In this case, the first cutting wire 350a can cut the first adhesive layer 35a, and the second cutting wire 350b can cut the second adhesive layer 35b. Ordinal numbers are assigned to the first adhesive layer 35a and the second adhesive layer 35b and the first cutting wire 350a and the second cutting wire 350b for convenience of the description, and the first and second adhesive layers and the first and second cutting wires can be regarded as the same adhesive layer 35 and the same cutting wire 350.

In addition, the holder 110 is provided to fix an end portion of the solar panel 30 and has a fixing member 111 and fixing pincers 112. The fixing pincers 112 can move in a length direction of the fixing member 111 or can rotate to hold the end portion of the solar panel 30. The pair of fixing pincers 112 can hold and fix the end portion of the solar panel 30 by approaching each other to narrow a gap therebetween. In addition, when the solar panel 30 is lowered to penetrate a half or more part of the guide roller units 200, the fixing pincers 112 can widen the gap therebetween to release the end portion of the solar panel 30.

With reference to FIGS. 4 and 1, FIG. 4 is a view illustrating a part of a shape of the solar panel 30 which is vertically lowered, the solar panel viewed by the image recognition unit 400 positioned below the wire cutting mechanism 300, (a) of FIG. 4 illustrates a shape acquired before correction performed by the image recognition unit, and (b) of FIG. 4 illustrates a shape acquired after correction performed by the image recognition unit. As illustrated in FIGS. 4 and 1, the image recognition unit 400 can image locations of the solar panel 30 and the cutting wires 350 and can control the locations thereof. As illustrated in (a) of FIG. 4, the adhesive layers 35 of the solar panel 30 can be disposed at locations which do not correspond to the cutting wires 350. In this case, the image recognition unit 400 can capture an image illustrated in (a) of FIG. 4 from below the wire cutting mechanism 300 and can compare and analyze the locations of the adhesive layers and the cutting wires. When the image recognition unit determines that the locations of the adhesive layers 35 do not match the locations of the cutting wires 350, the image recognition unit can adjust a location of the wire cutting mechanism 300 or adjust locations of the panel transporting mechanism 100 and the guide roller units 200 to overlap locations of the adhesive layers 35 and the cutting wires 350. In particular, the wire cutting mechanism 300 can move the support rollers 310, which guide the cutting wires 350, in an axial direction to adjust the locations. Otherwise, the panel transporting mechanism 100 and the guide roller units 200 can be both moved such that the locations can be adjusted. Hence, the solar panel cutting unit 1 can perform accurate cutting by adjusting the locations thereof by using the image recognition unit 400 before the cutting is performed.

Hereinafter, an operation process of the solar panel cutting unit according to the embodiment of the present invention will be described in detail with reference to FIGS. 5 to 9.

FIGS. 5 to 9 are operation views of the solar panel cutting unit illustrated in FIG. 1.

Figure 5:
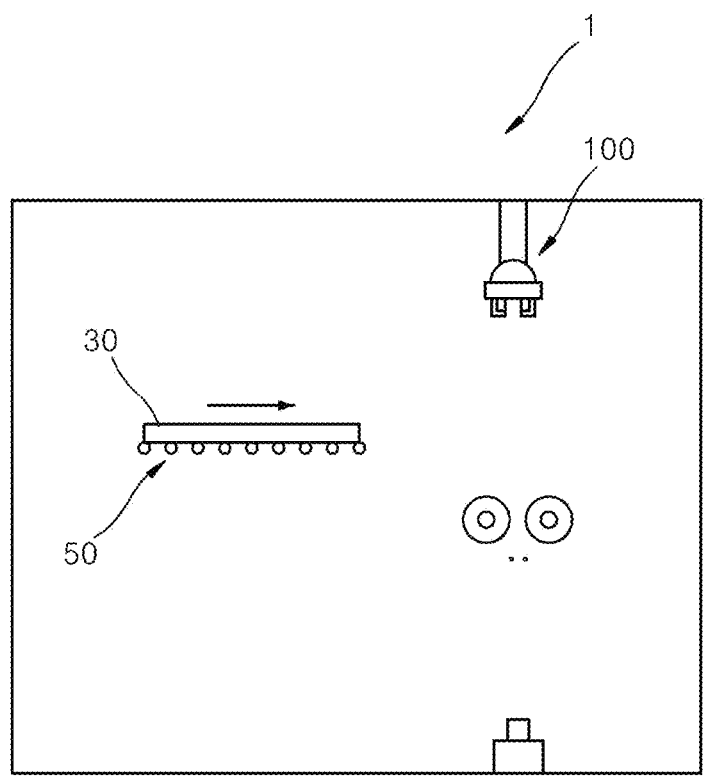
FIGS. 5 to 9 are operation views of the solar panel cutting unit illustrated in FIG. 1.
Figure 6:
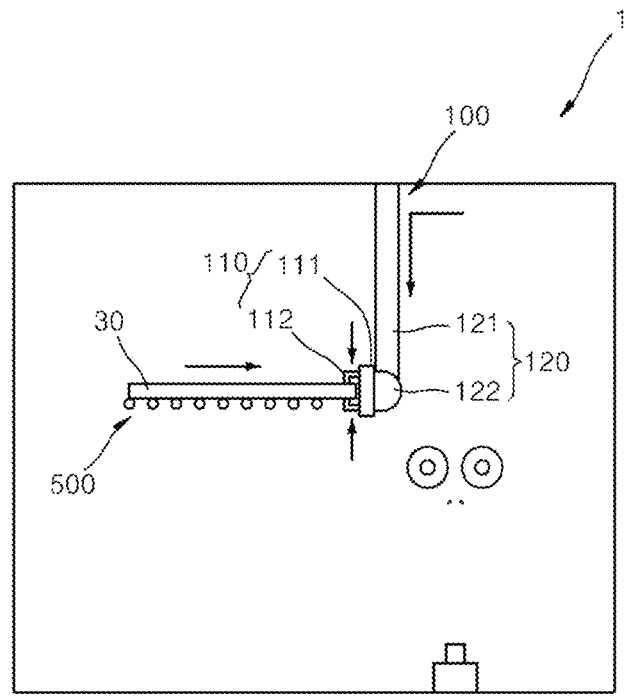
Figure 7:
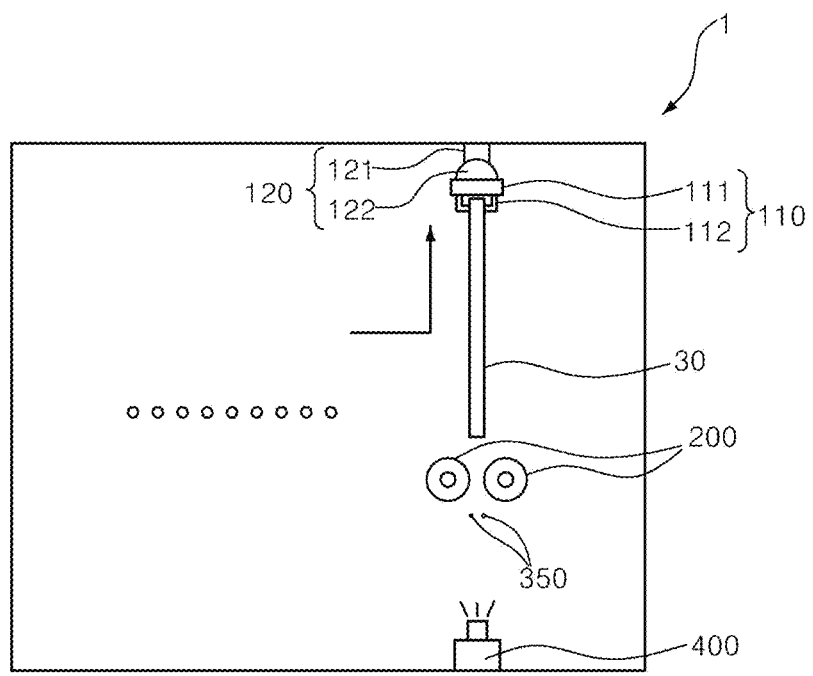
Figure 8:
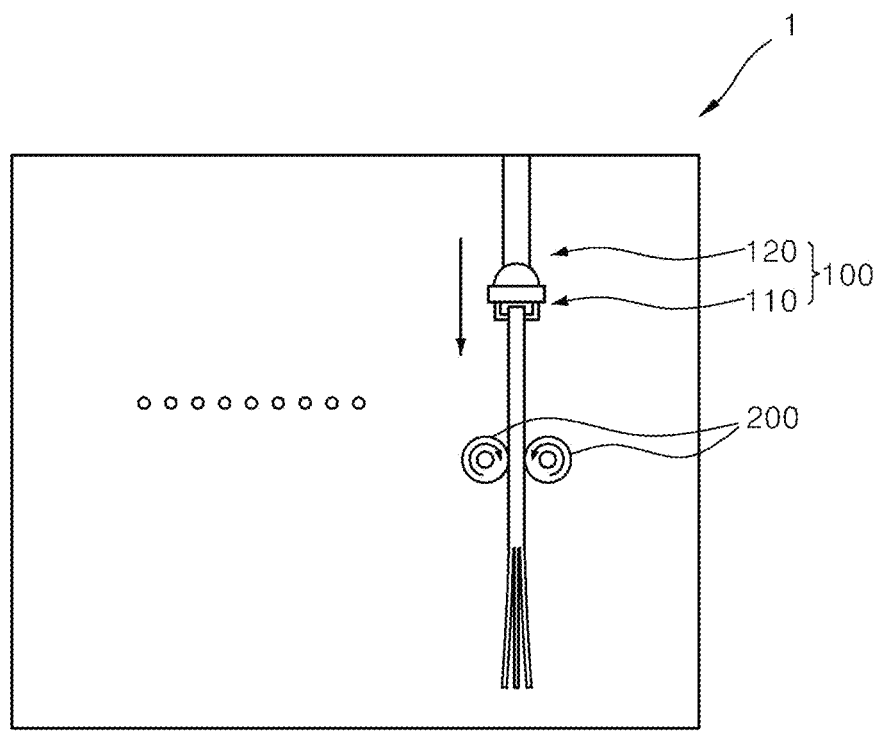
Figure 9:
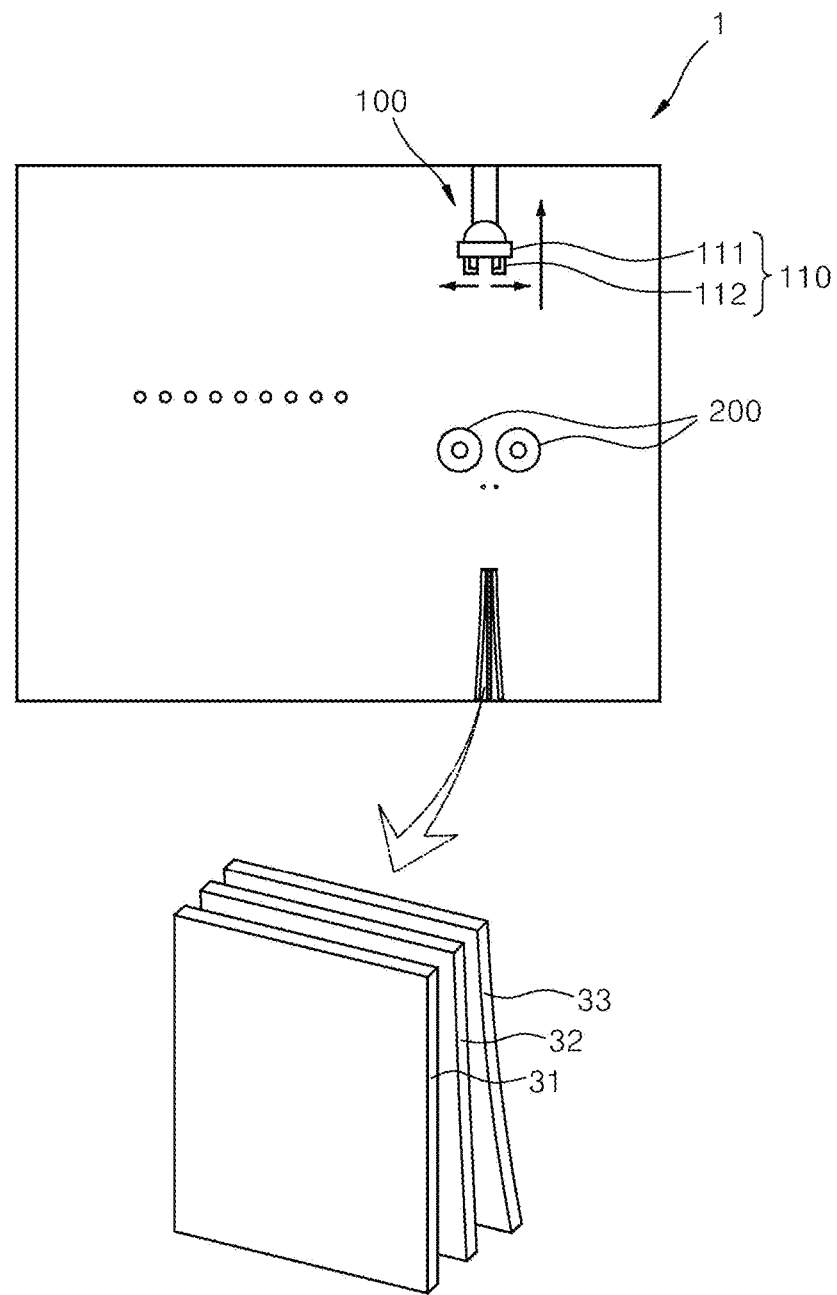

FIGS. 5 to 7 illustrate preparation steps before the layers of the solar panel 30 are separated, and FIGS. 8 and 9 illustrate steps of separating the layers of the solar panel 30.

With reference to FIG. 5, the solar panel 20 is inserted horizontally from one side and is transported in one direction along with rotation of the horizontal moving mechanism 500. The solar panel 30 can receive radiant heat from the heater (see 600 in (b) of FIG. 2) positioned at both sides in a transport process, and thus a temperature of the solar panel can be increased. When the temperature of the solar panel 30 is increased, the adhesive layers 35 which adhere the thin layers can be melt and have low adhesive strength. That is, the solar panel 30 can be transported along the horizontal moving mechanism 500 to be supplied to the panel transporting mechanism 100 positioned behind the horizontal moving mechanism 500 in a state where the solar panel is preheated.

With reference to FIG. 6, the panel transporting mechanism 100 can be positioned behind the horizontal moving mechanism 500 and can hold the solar panel 30 transported along the horizontal moving mechanism 500. In this case, the manipulation element 120 is moved along the frame 10 to a side of the horizontal moving mechanism 500 and causes the holder 110 to be located at the end portion of the solar panel 30. Here, the length of the body of the vertical manipulation element 121 is extended to locate the holder 110 at a height of the solar panel 30, and the rotational manipulation element 122 is rotates the holder 110 in a clockwise direction. The holder 110 moved by the manipulation element 120 holds the end portion of the solar panel 30 by using the fixing pincers 112.

With reference to FIG. 7, the panel transporting mechanism 100 vertically lifts the solar panel 30 held in a horizontal state and transports the solar panel above the guide roller units 200. In this case, the heaters 600 can be positioned at both sides of the panel transporting mechanism 100, and the solar panel 30 preheated at the horizontal moving mechanism 500 can be re-heated at the panel transporting mechanism 100. That is, the heater 600 can be positioned at a side portion of at least one of the horizontal moving mechanism 500 and the panel transporting mechanism 100 and can heat the solar panel 30. In addition, the solar panel 30 is located between the pair of guide roller units 200 by the panel transporting mechanism 100. In this case, the image recognition unit 400 can be positioned below the pair of guide roller units 200, can image relative locations of the solar panel 30 and the wire cutting mechanism 300, and can adjust the locations thereof.

With reference to FIG. 8, in a state where location adjustment of the solar panel 30 is completed, the solar panel is lowered vertically by the panel transporting mechanism 100. The manipulation element 120 of the panel transporting mechanism 100 is extended below and vertically lowers the solar panel 30. In this case, a leading end portion of the solar panel 30 is inserted into the pair of guide roller units 200 and is lowered. The pair of guide roller units 200 can lower the solar panel 30 to an accurate location while rotating according to a traveling direction of the solar panel 30. A pair of adhesive layers 35 of the solar panel 30 is lowered while the pair of adhesive layers penetrate the cutting wires 350 penetrating the pair of adhesive layers 35, and the cutting wires 350 move at a high speed in one direction from a designated location and cut the adhesive layer 35).

With reference to FIG. 9, when cutting of the adhesive layer 35 is completed, the glass plate 31, the solar cell layer 32, and the backsheet layer 33 of the solar panel 30 are separated from each other, and the panel transporting mechanism 100 releases the fixing pincers 112 of the holder 110 and is lifted. The glass plate 31, the solar cell layer 32, and the backsheet layer 33 which are completely separated from each other can be discarded or recycled through a recycling process suitable regarding materials thereof.

As described above, the embodiments of the present invention are described with reference to the accompanying drawings; however, a person of ordinary skill in the art to which the present invention pertains can understand that the present invention can be realized as another embodiment without changing the technical idea or an essential feature of the present invention. Therefore, the embodiments described above need to be understood as exemplified embodiments and not as embodiments to which the present invention is limited in every aspect.

The present invention has high industrial applicability in that the present invention can separate layers of a solar panel at once and the separated thin layers can be recycled suitably regarding materials thereof.

What is claimed is:
1. A solar panel cutting unit comprising:
   a frame;
   a panel transporting mechanism provided at the frame, the panel transporting mechanism comprising a holder configured to hold a solar panel and a manipulation element configured to enable the holder to move and rotate and configured to lower the solar panel in a vertical direction such that adhesion lines of thin layers of the solar panel are arranged downward;

a pair of guide roller units positioned below the panel transporting mechanism and configured to press a front and rear surfaces of the solar panel in order to guide and lower the solar panel; and a wire cutting mechanism comprising a pair of support rollers and cutting wires which connect the support rollers to each other and extend in the same direction as the adhesion lines such that the wire cutting mechanism separates the thin layers of the solar panel from each other.

2. The solar panel cutting unit according to claim 1, wherein at least one of the wire cutting mechanism and the pair of guide roller units is moved to match locations of the adhesion lines and the cutting wires.

3. The solar panel cutting unit according to claim 2, further comprising:

an image recognition unit provided below the cutting wires, configured to image the solar panel and the cutting wires and locate the adhesion lines and the cutting wires.

4. The solar panel cutting unit according to claim 1, wherein the solar panel has the adhesion lines formed in parallel between the thin layers, and wherein the cutting wires are disposed at a plurality of respective locations at the same intervals as intervals of the adhesion lines.

5. The solar panel cutting unit according to claim 4, wherein an outer circumferential surface of each of the support rollers has a plurality of guide grooves into which the cutting wires are inserted to be moved and which are formed at the same intervals as the plurality of adhesion lines.

6. The solar panel cutting unit according to claim 5, wherein the support rollers are configured to be moved in a length direction of respective rotary shafts such that locations of the cutting wires match locations of the adhesion lines.

7. The solar panel cutting unit according to claim 1, wherein, the panel transporting mechanism stands the solar panel, which is loaded in a horizontal direction with absorption surface absorbing solar light facing upward or downward, vertically upright and lowers the solar panel.

8. The solar panel cutting unit according to claim 7, further comprising:

a horizontal moving mechanism configured to move the solar panel in a state where a reflective surface of the solar panel is parallel to a ground in the horizontal direction and deliver the solar panel to the panel transporting mechanism, wherein the panel transporting mechanism is configured to hold the solar panel in the state by the holder, rotate the holder, and lower the solar panel in the vertical direction.

9. The solar panel cutting unit according to claim 1, further comprising:

a heater provided at the frame and configured to heat the solar panel.

* * * * *